US007002166B2

(12) United States Patent
Jamieson et al.

(10) Patent No.: US 7,002,166 B2
(45) Date of Patent: Feb. 21, 2006

(54) METHOD AND SYSTEM FOR SINGLE ION IMPLANTATION

(75) Inventors: David Norman Jamieson, Melbourne (AU); Steven Prawer, Sydney (AU); Andrew Steven Dzurak, Potts Point (AU); Robert Graham Clark, Balgowlah Heights (AU); Changyi Yang, Box Hill (AU)

(73) Assignee: Qucor Pty Ltd, Sydney (AU)

( * ) Notice: Subject to any disclaimer, the term of this patent is extended or adjusted under 35 U.S.C. 154(b) by 30 days.

(21) Appl. No.: 10/484,647

(22) PCT Filed: Aug. 27, 2002

(86) PCT No.: PCT/AU02/01150

§ 371 (c)(1),
(2), (4) Date: Jun. 22, 2004

(87) PCT Pub. No.: WO03/019635

PCT Pub. Date: Mar. 6, 2003

(65) Prior Publication Data

US 2004/0232353 A1 Nov. 25, 2004

(30) Foreign Application Priority Data

Aug. 27, 2001 (AU) .................................... PR7289

(51) Int. Cl.
*H01L 21/265* (2006.01)
*H01L 31/115* (2006.01)
*H01J 37/304* (2006.01)
*G06N 1/00* (2006.01)
*G01T 1/00* (2006.01)

(52) U.S. Cl. ................................. 250/492.21; 250/397

(58) Field of Classification Search ..................... None
See application file for complete search history.

(56) References Cited

U.S. PATENT DOCUMENTS 5,539,203 A 7/1996 Ohdomari
5,929,645 A * 7/1999 Aton ........................... 324/751
5,945,677 A 8/1999 Leung et al.

FOREIGN PATENT DOCUMENTS

JP 2001-015059 A 1/2001
WO WO 99/14614 A1 3/1999
WO WO 01/80980 A1 11/2001
WO WO 02/18266 A1 3/2002
WO WO 02/19036 A1 3/2002

OTHER PUBLICATIONS

Shinada et al., Current status of single ion implantation, Journal of Vacuum Science Technologies B, vol. 16 No. 4, (1998), pp 2489-2493.*

Koh et al., Quantitative characterization of S/SiO.sub.2 interface traps induced by energetic ions by means of single ion microprobe and single ion beam induced charge imaging, Applied Surface Science, 117/118, (1997), pp 171-175.*

(Continued)

*Primary Examiner*—Jack I. Berman
(74) *Attorney, Agent, or Firm*—Wood, Phillips, Katz, Clark & Mortimer

(57) ABSTRACT

This invention concerns a method and system for single ion doping and machining by detecting the impact, penetration and stopping of single ions in a substrate. Such detection is essential for the successful implantation of a counted number of $^{31}P$ ions into a semi-conductor substrate for construction of a Kane quantum computer. The invention particularly concerns the application of a potential across two electrodes on the surface of the substrate to create a field to separate and sweep out electron-hole pairs formed within the substrate. A detector is then used to detecting transient current in the electrodes, and so determine the arrival of a single ion in the substrate.

38 Claims, 4 Drawing Sheets

OTHER PUBLICATIONS

Millar et al., Nanoscale fabrication using single-ion impacts [online], Proceedings of SPIE: BioMEMS and Smart Nanostructures, Nov. 2001, 4590, p. 173-78, URL:http://www-.ph.unimelb.edu.au/src/SRCpapers/nanafab.pdf.
Buehler et al., Self-aligned process for silicon quantum computer devices [online], Aug. 29, 2002, URL:http://arxiv.org/PS_cache/cond-mat/pdf/0208/0208374.pdf.
Schenkel et al., Single ion implantation with low energy highlt charged ions [online], Abstract for the 14th International Conference on Ion Implantation Technology, IIT 2002, Sep. 22-27, 2002, Taos, NM, URL:http://www.iit2002.com/Abstracts/NovelTechniquesCONVERTED/SchenkelA3122.pdf.

* cited by examiner

METHOD AND SYSTEM FOR SINGLE ION IMPLANTATION

TECHNICAL FIELD

This invention concerns a method and system for single ion doping and machining by detecting the impact, penetration and stopping of single ions in a substrate. Such detection is essential for the successful implantation of a counted number of $^{31}P$ ions into a semi-conductor substrate for construction of a Kane quantum computer.

An ion is an atom that has been ionised. We adopt the convention of using the term 'ion' while the atom is in motion, regardless of its ionised state. After the ion has come to rest, we call it an 'atom'.

BACKGROUND ART

The Kane computer[1] requires single donor $^{31}P$ atoms to be placed in an ordered 1D or 2D array in crystalline silicon. The atoms must be separated from each other, by 20 nm or less. An alternative architecture is that of Vrijen et al.[2] who propose an array of $^{31}P$ atoms in a heterostructure where the atom spacing can be larger than the Kane computer but still of the order of 100 nm. Such precise positioning has proved extremely difficult using conventional lithographic and ion implantation techniques, or using focused deposition. This difficulty is not only with regard to forming arrays of donor atoms with sufficient precision, but also ensuring that only single donor atoms have been introduced into each cell of the array.

Optical lithography has been utilised by semiconductor industries to manufacture integrated circuits with great precision. Optical lithography systems include an exposure tool, mask, resist and processing steps to accomplish pattern transfer from a mask, to a resist, and then to a device. However, the use of resist layers can limit resolution to the wavelength of the radiation used to transfer the pattern in the mask onto the resist. This is presently about 100 nm.

Electron beam lithography, which uses a finely focused electron beam to directly write patterns into resists, can attain better than 20 nm resolution. Further, the "top-down-process", described in a recent patent application, uses electron beam lithography to construct arrays of nanoscale channels in resists. The resist is then irradiated with an ion beam so that ions impact at random on the surface allowing a random array of channels to direct one or more atoms through into the substrate to construct nanoscale structures.

However, in all of these lithographic techniques, control of the number of atoms reaching the substrate is not possible.

Lüthi et al.[4] describe a resistless lithography technique which enables the fabrication of metallic wires with linewidths below 100 nm. The technique is based on an ultra-high resolution scanning shadow mask, called a nanostencil. A movable sample is exposed to a collimated atomic or molecular beam through one or more apertures in an atomic force microscope (AFM) cantilever arm. Standard V-shaped $Si_3N_4$ cantilevers with integrated tips having a spring constant below 0.1 $Nm^{-1}$ were used. The aperture diameter ranged from 50 to 250 nm depending on the desired mask structure. Scanning the sample with respect to the nanostencil allowed the structure to be laid down on the surface of the sample. After nanostructuring, the structure was inspected with the AFM tip.

This former method allows precise positioning of large numbers of atoms but not implanting and detecting single ions.

Shinada et al.[5] have developed a single ion detection technique using a single ion implantation assembly developed by Koh et al.[6] The single ion implantation assembly consisted of a pair of deflector plates, an objective slit, a precision quadropole-magnet, a target, an electron multiplier tube (EMT) and a chopper control circuit connected to the deflector plates and the EMT. The ion beam is chopped with the pair of deflector plates, over which the potential difference can be switched. Each single ion is extracted one by one from a continuous ion beam by adjusting the ion beam current, the objective slit diameter and the switching time of the potential difference applied to the deflector plates.

The extracted single ion is then focused with the quadropole-magnet lens and impacts on the target. The number of incident ions is controlled by the EMT by detecting secondary electrons emitted upon ion incidence. Signals from the EMT are fed to the chopper control circuit which keeps on sending the beam chopping signals to the deflector until the desired number of single ions are detected.

Shinada et al.[5] emphasised findings by Koh[6] by reporting that the key to controlling the incident ion number is the detection of secondary electrons emitted from a target upon ion incidence.

The secondary electron detection efficiency $P_d$ is defined as follows:

$$P_d = \frac{N_{SE}}{N_{ext}},$$

where $N_{SE}$ is the average number of detected secondary electrons by a single chop and $N_{ext}$ is the average number of extracted ions by a single chop, where $N_{ext}$ is proportional to the ion beam current and the time of beam chopping.

To determine the efficiency in the determination of secondary electrons, a 60 keV $Si^{2+}$ ion beam was chopped with a frequency of 100 kHz. NSE was estimated by dividing the number of secondary electron counts per second by $10^5$. To evaluate $N_{ext}$, a standard fission track detector was used.

The secondary electron detector included a photomultiplier tube with a scintillator and a light guide. A grid electrode was used to guide the secondary electrons to the sensitive part of the scintillator.

The experimental result for $P_d$ was 90%. The error was partially attributed to the limitations of the secondary electron detection system. Furthermore, results showed that the single ion incident position could be successfully controlled with an error of less than 300 nm.

This detection of impacts from the pulse of secondary electrons emitted from the surface due to the ion impacts does not distinguish ion impacts with a mask from ion impacts with an exposed substrate under the mask.

DISCLOSURE OF INVENTION

In first aspect the invention is a method for single ion doping and machining by detecting the impact, penetration and stopping of a single heavy ion in a substrate, the method comprising the steps of:

impacting electrically active substrate with single ions to generate electron-hole pairs;

applying a potential applied across two electrodes on the surface of the substrate to create a field to separate and sweep out electron-hole pairs formed within the substrate; and detecting transient current in the electrodes and so determine the arrival of a single ion in the substrate.

An advantage of the method is that it can be scaled to produce arrays of single atoms using low energy (keV) ion implantation. Also, it is sensitive only to ions that reach the substrate and ignores ions that strike surface masks. It produces a record of each ion impact for verification and further analysis. The ions are detected with close to 100% efficiency. And, it can be used with MeV ions to exploit the latent damage from the passage of a single ion to nanomachine sensitive materials.

The substrate may be a pure semiconductor substrate, such as a high resistivity silicon substrate. However any substrate may be used that is electrically active in the sense that it is ioniseable to form electron-hole pairs with a useful lifetime.

Ions may be applied by the use of a focused beam of ions from a field ionisation ion source producing sub-20 nm ion beam probes. Alternatively, a broad-beam implanter can be used. The ion beam current may be adjusted to a level low enough to minimise the probability of multiple ion strikes during the time required to gate off the beam. The required current will depend on the response speed of the ion strike detection and beam gating circuitry. Typically the current will be one hundred atoms per second. Such a beam probe can be used to inject single ions at desired locations either with or without a mask. The required beam current can be tuned by using the single ion detector signal incident on a peripheral region of the substrate that is not itself required in the device to be fabricated.

We will now describe the technique by which ions are detected using the invention. Implanted ions stop in the substrate at a depth determined by the initial ion energy and the stopping power of the substrate. There are two energy loss processes which determine the stopping power. First, nuclear processes where a close collision occurs between a projectile and the substrate nucleus causing a recoil and straggling. Second, electronic processes where ion kinetic energy is transferred to ionisation of the substrate and its attendant production of electron hole pairs. It should be appreciated that only the electronic processes produce a signal detectable by the method.

The ionisation is detected by electrodes which may be placed adjacent to the region to be implanted. Both electrodes may be on the front surface, or one on the front surface and one on the rear surface depending on application. A bias voltage may be applied across them to detect the ion impacts. This leads to the possibility of measuring the polarity of the ion-impact-induced signal as a measure of the proximity of the ion strike to the positive or negative electrode. So, it may be possible to have two nanomachined apertures in the substrate that are implanted with a broad beam, then the aperture which actually receives the ion strike could be identified from the relative strength and polarity of the signal collected from the two electrodes.

A substrate cooling system may be required to maintain the substrate at a low enough temperature (of the order of 77K) to allow sufficient signal to noise ratio to detect keV ions (for MeV ions the substrate may be held at room temperature).

A prototype system has been shown to give very few false signals, such as random noise or from ions that do not penetrate sufficiently far into the substrate. Pulse shape discrimination can eliminate these events.

Acceptable detection signals may be used to generate a gate signal, via a computer, to a feedback circuit which may then gate off the ion beam. Such a control signal may also step a mask to a new position above the substrate for a further implant whereupon the beam is gated on once again.

The system may be enhanced by the use of a thin, ion sensitive resist, that may be processed to reveal the impact sites of single ions. The incident ions pass through the thin resist and enter the substrate leaving a trail of latent damage which can be developed by standard techniques to reveal a pit that can-be imaged with an Atomic Force Microscope (AFM). The resulting image of the pits reveals the sites where the implanted ions have entered the substrate.

The system may also be enhanced by the use of a thick resist layer as a nanomachined mask, that blocks the ions from entering the substrate except for the open areas in the mask which expose the desired areas in the substrate where single ions are to be implanted.

For the construction of a two atom device, two apertures may be opened in the mask. This may be achieved using some of the metal electrodes in the finished device. In this case, metal electrodes are fabricated using conventional Electron Beam Lithography (EBL), then a resist layer is deposited. A cross line is drawn with the EBL system across the linear electrodes which upon development then opens a path to the surface leaving the substrate exposed. The mask now consists of the thick metal electrode and the resist layer. Ions can be implanted down the paths beside the electrodes. Some ions will stop in the metal of the electrode, but this will not produce a signal in the ion detection system because ion impacts with metals produces very little charge.

There will be an approximately 50% chance of producing a device with a single ion in each aperture. This chance will be actually greater than 50% owing to lateral ion straggling. For example, the lateral straggling of 15 keV $^{31}P$ ions implanted into silicon for the Kane quantum computer is about 7 nm[7]. There is a significant probability that the situation where both ions entered the substrate through the same aperture will result in the implanted atoms ending up in different locations. They may therefore be separately addressed with the A and J gate electrodes of the quantum computer. There is a significant probability that one or both of the ions will end up in the most desirable location under the A gate electrode itself due to ion straggling. In any case, appropriate tuning of the gate potential can still address the atom, even if it is not precisely located under the electrode. Technology Computer Aided Design (TCAD) calculations show that as long as the two atoms are in different places, they can still be individually addressed.

The system may be used to scale up the array of implanted ions by the use of a moveable mask consisting of a nanomachined aperture in an AFM cantilever which may be accurately positioned above the desired location of the atoms and then irradiated with an ion beam.

The nanomachined apertures may be fabricated with EBL in the resist layer. Alternatively, the nanomachined aperture may be drilled in a standard cantilever and may form part of a Scanning Tunneling Microscope (STM) or an Atomic Force Microscope (AFM). The nanomachined aperture may be fabricated using a Focused Ion Beam (FIB) which itself usually employs a focused beam of Ga ions, diameter less than 20 nm, to image and machine the specimen. By first imaging the cantilever tip with the FIB, the location of the nanomachined aperture can be then accurately drilled at a known location relative to the cantilever tip.

Accurate positioning of the nanomachined aperture above the specimen may be accomplished by using the STM or AFM to first locate and image registration marks on the substrate using the same cantilever containing the nanomachined aperture and to thus effectively align the aperture for an ion to pass through the aperture to implant an ion into the substrate.

Between each implant step, the cantilever could be used to image the ion impact site to image chemical or morphological changes that occur as a result of ion impact to verify that a single ion has been successfully delivered to the substrate.

The moveable mask may be controlled to a precision of less than about 1 nm. The thickness of the moveable mask is sufficient to stop the incident ion beam so that no ions are transmitted except through the aperture.

The system can also be used to produce scaled up arrays directly by using a FIB to implant the ions. The focused probe in the FIB is a sub-20 nm spot. In this case the focused probe is scanned over the substrate, dwelling on the places where the ions are to be implanted. The beam blanking and scan advance is gated on the ion impact signal. The FIB is configured to produce the ion beam required for the particular application by use of an appropriate eutectic alloy in the ion source. A combination of the nanomachined mask and the scanned FIB can be used if the FIB probe size is larger than the apertures in the mask. In this case the probe is scanned to dwell on the apertures in the mask.

We will now describe a method of testing the detector. The method may also be used in a test mode where other ionising radiation, such as X-rays or electrons are applied to cause detectable ionisation. Such a test will confirm that the substrate is electrically active and that the system is working and is sufficiently efficient to detect ion impacts, before ion implantation.

This may be done with a small radioactive source (or other appropriate source of X-rays) that is swung into place in front of the substrate to be implanted. The X-rays deposit the fixed amounts of energy, depending on the source, in the substrate without doing any damage. A pulse height spectrum then provides an indication of the quality of the device. The X-rays penetrate surface layers and can therefore be used even in devices that are completely covered with resist films.

A tuneable energy electron source, or a source of different energy x-rays, could also be used to provide multiple energy particles for energy calibration of the pulse height spectrum.

For all these methods, the ion-induced damage in the substrate must be annealed. After ion implantation a focused laser beam may be used to anneal the ion beam induced damage from the single ion impacts. We have shown this to work well with diamond[8,9] where localised regions (less then 10 microns in diameter) can be annealed without significantly heating the rest of the specimen. An alternative strategy is to use rapid thermal annealing which heats the entire substrate, but this may cause damage to preexisting structures In a second aspect the invention is a system for single ion doping and machining by detecting the impact, penetration and stopping of a single ion, such as $^{31}$P below 20 keV, in a substrate, comprising:

an electrically active substrate where ion or electron impact generates electron-hole pairs;

at least two electrodes applied to the substrate;

a potential applied across the electrodes to create a field to separate and sweep out electron-hole pairs formed within the substrate; and a current transient sensor to detect current in the electrodes and so determine the arrival of a single ion in the substrate.

In other applications the invention may be used to employ the passage of a single ion to nanomachine optical fibres or other materials with high precision. In this application the object to be machined is positioned on top of an active substrate (which can be a commercially available particle detector). Typically MeV ions would be used which have a range of the order of 100 micrometers. The active substrate produces a signal which records the passage of single ions through the object to be machined allowing the ion beam to be stepped by one of the methods already described. After exposure in the desired locations, the latent damage produced by the passage of single ions can be developed to create the nanomachined structures.

The invention may be used to control dopant implantation in integrated chip components in order, for example, to create a regular array of dopant atoms in the gates of transistors. Ordered arrays of dopants may give the device desirable electrical properties for the reduction of electron scattering.

BRIEF DESCRIPTION OF DRAWINGS

An example of the invention will now be described with reference to the accompanying drawings; in which.

BEST MODES FOR CARRYING OUT THE INVENTION

This example describes the invention in the context of the construction of a Kane quantum computer which requires $^{31}$P ions with an energy below 20 keV.

Figure 1:
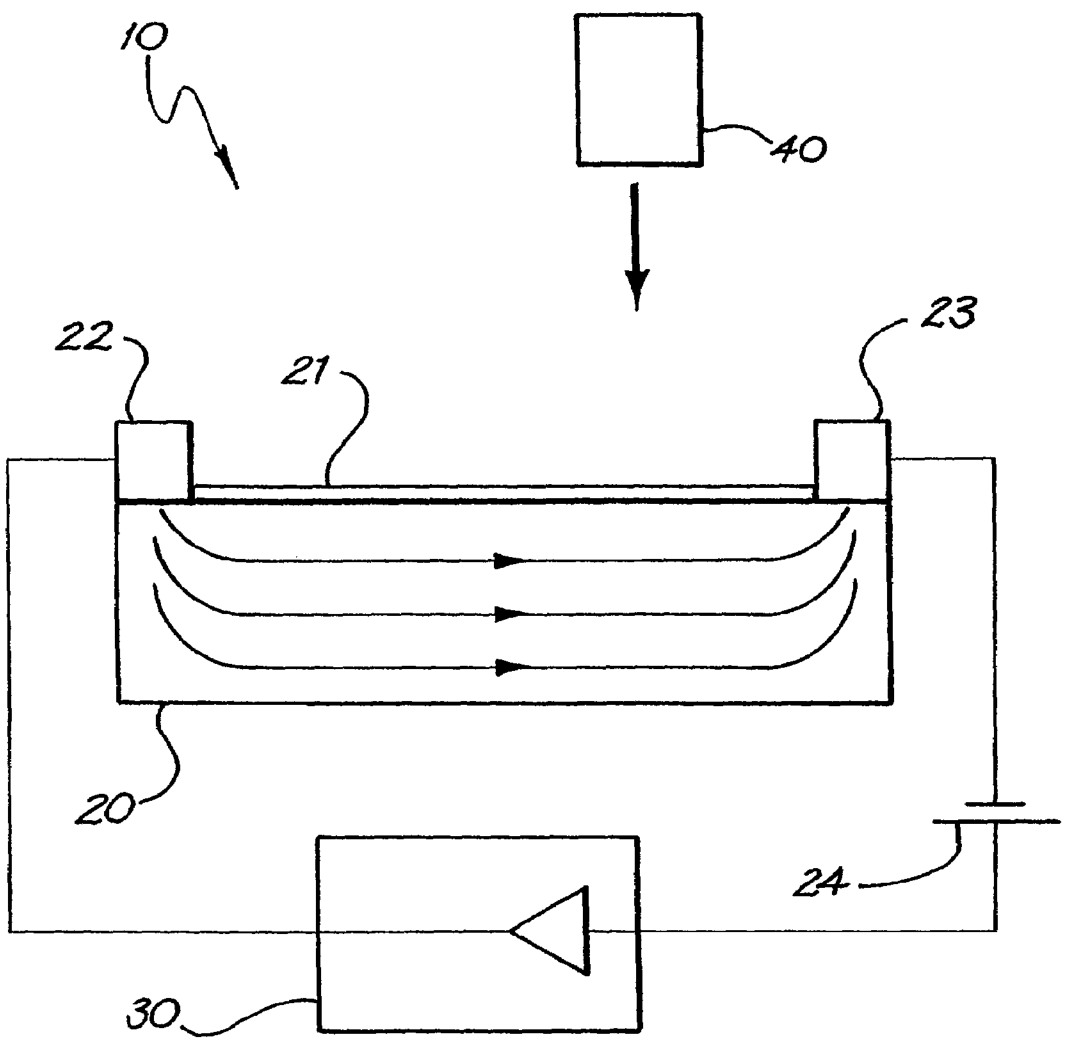
FIG. 1 is a schematic diagram of an ion detection system.

Referring first to FIG. 1 system 10 is used for detecting the impact, penetration and stopping of a single heavy ion, such as $^{31}$P below 20 keV, in a substrate. The substrate 20 is a 0.2 mm thick silicon wafer of greater than 1000 Ω·cm resistivity mounted on a metal contact and earthed. The entire substrate is electrically active silicon and the implantation of a $^{31}$P ion will generate electron-hole pairs. There is a layer of oxide 5 nm thick 21 and two electrodes 22 and 23 on the surface of the substrate. A potential 24 is applied across the electrodes to create an electric field parallel with the surface to separate and sweep out electron-hole pairs formed within the substrate. A current transient sensor 30 is used to detect transient current in the electrodes and so determine the arrival of a single ion in the substrate.

Since the device 10 has no metal layer or doped layer at the surface, the dead layer 21 thickness can be made much thinner than in devices constructed with a p-n junction or a Schottky structure.

The results of the charge collection efficiency measured in the substrate 20 improved by about 10% to at least 96% when the resistivity of the silicon substrate was increased from 1000 to around 5000–7000 Ω·cm when tested with MeV ion impacts. Hence, substrates made with a high resistivity silicon substrate of high resistivity are most suitable in the fabrication of arrays of single ions using the detection of electrical transients in the substrate from ion impact method. Further improvements in efficiency occur upon cooling the substrate and associated ion detection circuitry to low temperatures, and using Schottky barriers under the electrodes.

When an ion penetrates the substrate it excites electrons out of their energy levels and consequentially leaves holes. These charge carriers are separated by an electric field applied to the electrodes. The negative charge carrier drifts towards the positive electrode and the positive charge carriers drift towards the negative electrode with a velocity which is dependent on the electric field strength. The resulting electrical transient is detected to generate the ion impact signal.

If the high field region does not extend completely through the substrate, a dead region may exist between the electrodes corresponding to an area of low field. Any charge carriers which enter this dead region will have a velocity close to zero and will only drift a minimal distance and will hence recombine. Therefore the electrode configuration must be such that the dead region is as small as possible. The movement of the remaining charge carriers constitutes a small current which can be expressed in terms of a current transient.

The detection of a current transient, indicates that a single atom has been implanted into the substrate at the desired location. The signal from the ion detection system is then used to deflect the ion beam thereby preventing penetration of further ions.

Numerical simulations have been used to optimise the electrode positions to maximise this signal. For $^{31}P$ ions with an energy up to a few 10's of keV, only about 15% of the residual kinetic energy deposited in the active layer below the oxide produces electron-hole pairs and hence a signal. The remainder, termed the pulse height defect, is lost to nuclear collisions.

Cooling the high purity substrate to the temperature of liquid nitrogen, and appropriate thermal treatment of the detector electrodes to allow large bias voltages to be applied improve system performance.

The current transient sensor 30 includes a detector preamplifier and amplifier system capable of pulse shape discrimination. Pulse shape discrimination may be accomplished by use of a digital storage oscilloscope which digitises the entire transient caused by ion impact, or noise signal. Transient shapes which do not conform to those expected for ion impacts can be rejected.

The discimination can be performed by specalised electronics in the amplifier used to produce the charge transient signal. Spectroscopy amplifiers are available commercially with in-built pulse shape discrimination circuits (such as the ORTEC type 572) that produce a reject signal when pulse pile-up is detected. Pulse pile-up is when two ion signals arrive within a short time period resulting in one pulse with a distorted shape. Although pulse pile-up is not a problem for the strategy outlined here, similar circuits could be used to eliminate large, random noise pulse on the basis of their pulse shape.

The electrical pulse height of any ion beam induced charge in the detector system is used to register a single ion implant event. To prevent multiple implantation of ions at the same location in the substrate, a fast electrostatic deflector unit located upstream of the ion beam target chamber is utilised to deflect the incident ion beam after implantation of one ion is detected.

Figure 2:
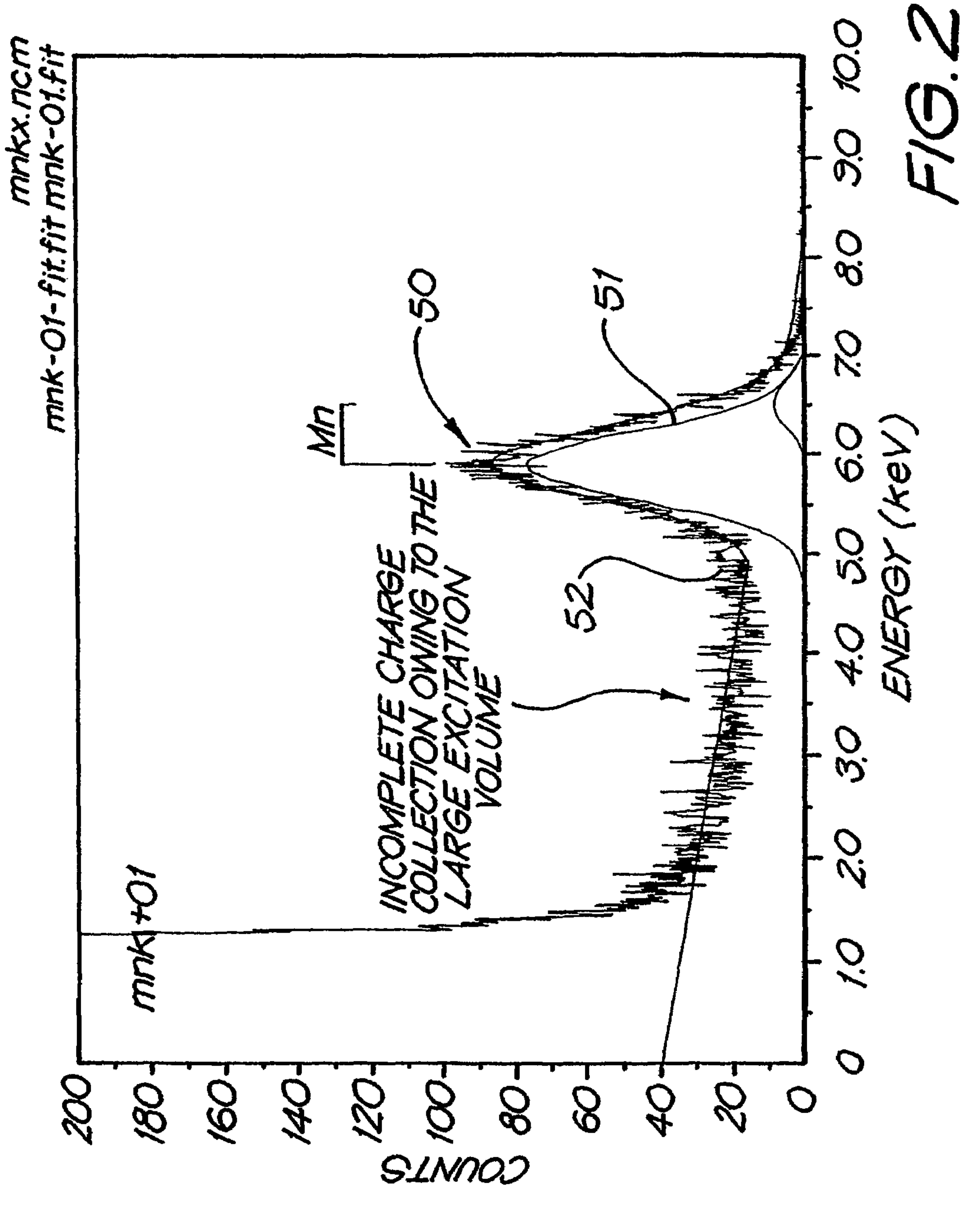
FIG. 2 is a graph of an X-ray spectrum from such a system.

The substrate and system are first tested by irradiating with X-rays from a radioactive source 40, for instance $^{55}Fe$ or $^{57}Co$. The X-rays penetrate the substrate and cause ionisation in a reversible manner without causing any damage. FIG. 2 is a graph of the results. The major peak 50 is made up of a signal peak 51 at 5.989 keV, representing $^{55}Mn$ $K_\alpha$ x-rays, the decay product from $^{55}Fe$, and a noise signal 52. There is also another minor peak centred at 6.4 keV from Mn $K_\beta$ x-rays. The peak 50 shows the X-rays have been detected.

Figure 3A:
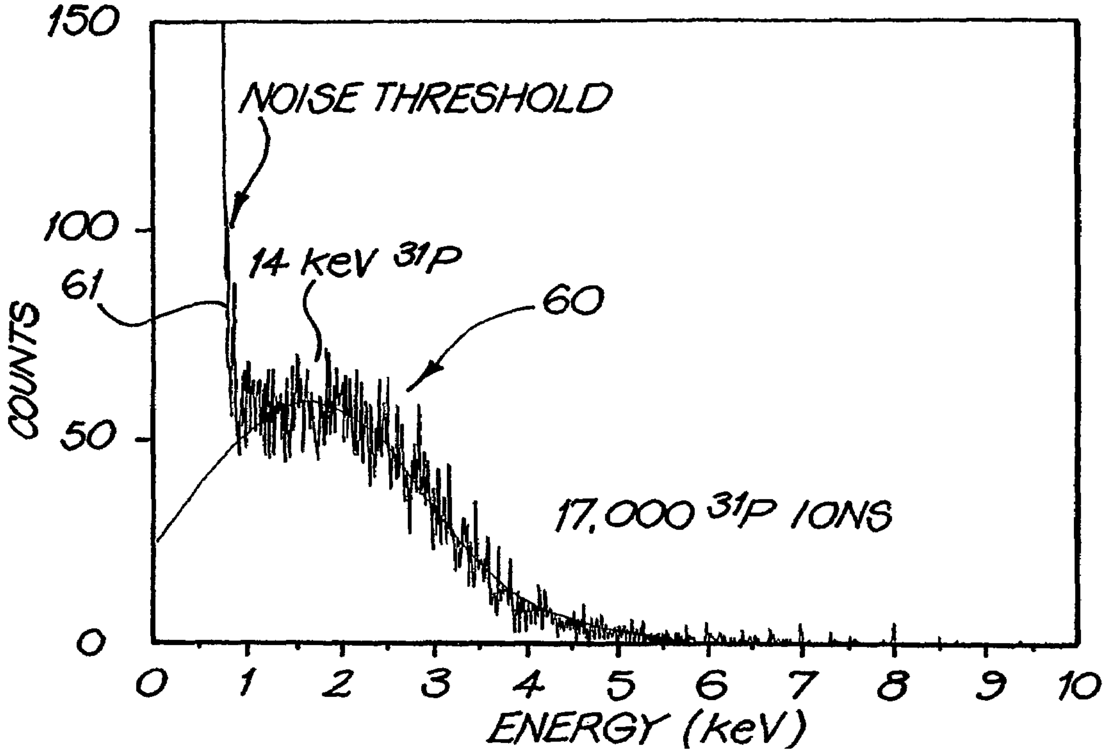
FIG. 3*a* is a graph of a pulse height spectrum of 14 keV $^{31}$P ion impacts from such a system.
Figure 3B:
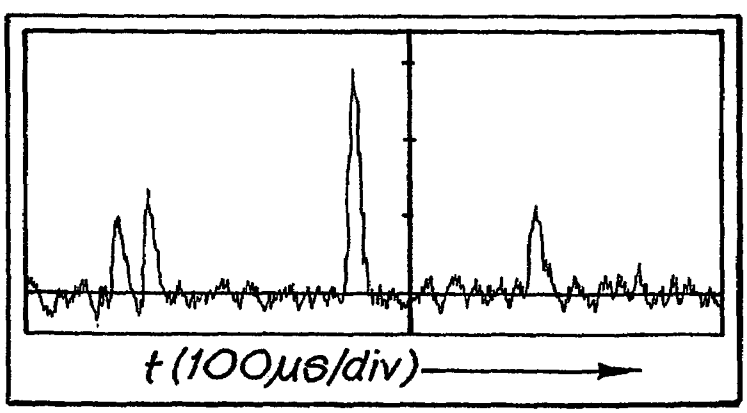
FIG. 3*b* is a graph of a transient generated from one such impact.

For $^{31}P$ ions with an energy up to a few 10's of keV, only about 15% of the residual kinetic energy deposited in the active layer below the oxide produces electron-hole pairs and hence a signal. Nevertheless, the noisy peak 60 shown in FIG. 3 demonstrates the the system works, and the spectrum shows the detection of 17,000 ion impacts. The noise signal 61 level of 1 keV will be reduced to below 0.5 keV with future improvements to the shielding of the ion detection circuits. The commercially available electronics for this application is rated at 0.2 keV noise level which is suitable for the Kane device.

Further work has taken place with a system in which the silicon substrate is covered with a 60 nm resist containing two nanomachined apertures irradiated with 15 keV $^{31}P$ ions. This experiment has detected two single $^{31}P$ ions being implanted. The evidence for this is shown by the spectra shown in FIG. 4.

Figure 4:
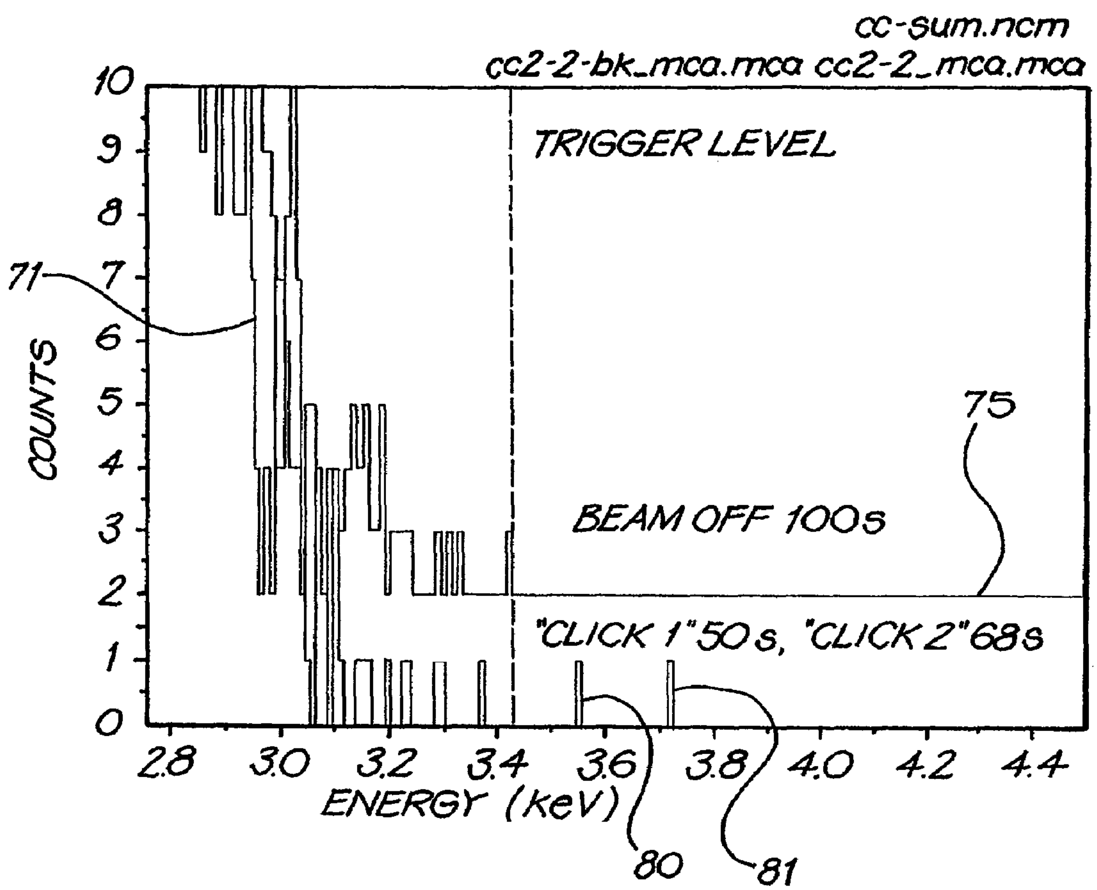
FIG. 4 is a graph of two 14 keV $^{31}$P ion impacts from such a system.

In FIG. 4 the noise signal 71 is greater than before, about 3 keV, so the trigger level was set at just above 3.4 keV. The experiment involved testing the noise signals with the beam off to set the trigger level above expected noise counts, and then only irradiating for a short time to decrease the likelihood of counting noise. A first ion ion impact signal 80 was detected after 50 s, and another 81 after 68 s. These results were at 3.55 keV and 3.71 keV respectively and represent deeply implanted atoms that experienced greater electronic stopping and less nuclear stopping than the average. This result will be improved later by reduction of the noise level.

Although the invention has been described with reference to a particular example it should be appreciated that many variations and refinements are possible. So too are many applications for the system and method.

Other devices will have a different configuration; the 5 nm surface oxide described here may not necessarily be present and the beam energy and species may be different.

The straggling caused by nuclear stopping process will introduce lateral and longitudinal tolerances in the $^{31}P$ atom locations. Also, calculations by Koiller et al suggest that the exchange coupling between electrons in silicon matrix is a strong function of separation Compensation of these effects will require appropriate potentials to be applied to the gates associated with each qubit. These gates allow the environment of the qubit to be changed allowing individual qubits to be addressed by an NMR pulse or other signals. The fidelity of this operation will depend on the tolerance of the qubit location and the amount of cross talk between qubits from a particular gate field. The gate fields have been calculated by TCAD which also provides the potential for the solutions to the Schrödinger equation allowing the qubit wave functions to be calculated. A fidelity of better than 1 part in $10^4$, required for operation of the device, can be achieved with potentials of less than 1–2 V per electrode which is less than the breakdown field of the oxide barrier.

An ion energy of around 15 keV is necessary to ensure the ion range is at the required depth in the substrate which is about 20 nm for the Kane device. A prototype quantum computer element is presently under construction which consists of 2 donors, to be implanted through a mask containing two apertures. When two ion impacts are registered, there is a 50% probability that each aperture contains 1 donor. Future devices will be fabricated using a focused $^{31}P$ beam stepped from cell to cell gated on an ion registration signal which provides the pathway to scaling up to many qubit devices.

We are also developing a moveable nanomachined mask integrated with an AFM cantilever as another pathway to scaling up the device.

The surface of the substrate may be patterned with registration marks to enable the region where the single atom array is to be located. The surface may then be scanned using an AFM in order to locate the registration marks on the surface. The known offset between the cantilever tip and a nano-machined aperture is then used to reposition the cantilever arm with the nano-machined aperture located above the desired location for implantation of the first atom.

The coarse positioning system may be used to move the AFM stage into position beneath the ion beam collimator so that the ion beam can irradiate the back of the cantilever lever and illuminate the nanomachined aperture.

Using an upstream Faraday cup, the beam current from the ion source is adjusted to a beam current of a few tens of pA. The beam is prevented from reaching the cantilever by switching on the deflector unit. Then the beam is directed to a non-essential corner of the substrate to tune the beam current to a few hundred atoms per second using the single ion detection system.

Switching off the deflector unit allows the ion beam to irradiate the cantilever arm.

The substrate is moved to the next location by moving the AFM stage 43. In some cases the AFM 32 can be used to image the location of the ion strike from the changes to the morphology of the surface caused by ion impact and hence verify the success of the ion implant. This will be the case with MeV heavy ions.

To enhance performance charge induced in the substrate must be collected to high efficiency. The device must have a low density of free charge carriers and a low density of defects ie., the charge carriers trapping centres. Cooling of the substrate can be used to reduce free carriers and also noise from the process of thermal ionisation. Without free carriers a low leakage current may be sustained when a high electrical field is applied in the sensitive volume ensuring efficient charge separation. A low density of charge carrier trapping centres and a high charge carrier drifting velocity will reduce the loss to the trapping centres during the charge collection. Additionally, it is desirable that the substrate has a high breakdown electrical field, so that high velocities of the carriers can be obtained in biased devices.

The pulse height in a device is often reduced or shows non-linear response to the ion energy due to three reasons:

1. The proportion of the ions energy loss to nuclear stopping without involvement in the ionisation process leading to the e-h pairs production (the Pulse Height Defect—PHD);
2. Charge loss at the trapping centres during charge drift or diffusion. This loss increases when the dense plasma produced by heavy ions shields the electrical field; and
3. Energy loss at the dead layers. Dead layers must be kept as thin as possible when keV ions are employed.

The references throughout the text above are incorporated herein by reference:

1. Kane, B. E., *A silicon-based nuclear spin quantum computer*, Nature, Vol. 393, p. 133, [1998].
2. Vrijen, R., Yablonovitch, E., Wang, K., Jiang, H. W., Balandin, A., Roychowdhury, V., Mor, T., and DiVincenzo, C. Phys. Rev. A62 (2000) 12306.
3. PCT Application No PCT/AU01/01056 in the name of Unisearch Limited filed 24 Aug. 2001.
4. Lüthi, R., Schlittler, R. R., Brugger, J., Vettiger, P., Welland, M. E., Gimzewski, J. K. *Parallel nanodevice fabrication using a combination of shadow mask and scanning probe methods*. Applied Physics Letters, Vol. 75, Number 9, [1999].
5. Shinada, T., Kumura, Y., Okabe, J., Matsukawa, T., Ohdormar, I. *Current status of single ion implantation*. Journal of Vacuum Science Technologies B, Vol. 16, Number 4, [1998], pp 2489–2493.
6. Koh, M., Igarashi, K., Sugimoto, T., Mausukawa, T., Mori, S., Arimura. T., Ohodomori, I. *Quantitative characterization of Si/Sio$_2$ interface traps induced by energetic ions by means of single ion microprobe and single ion beam induced charge imaging*. Applied Surface Science, 117/118, [1997], pp 171–175.
7. SRIM—*The Stopping and Range of Ions in Solids*, by J. F. Ziegler, J. P. Biersack and U. Littmark, Pergamon Press, New York, 1985
8. PRAWER, S., JAMIESON, D. N. and KALISH, R.—*An investigation of carbon near the diamond/graphite/liquid triple point*. Phys. Rev. Letts 69: 2991–2994 (1992).
9. ALLEN, M. G., PRAWER, S. AND JAMIESON, D. N.—*Pulsed laser annealing of P implanted diamond*. Appl. Phys. Lett. 63/15: 2062–2064 (1994).

The invention claimed is:

1. A method for single ion doping and machining by detecting the impact, penetration and stopping of a single heavy ion in a substrate, the method comprising the steps of:

impacting an electrically active substrate with single ions to generate electron-hole pairs;

applying a potential applied across two electrodes on the surface of the substrate to create a field to separate and sweep out electron-hole pairs formed within the substrate; and detecting transient current in the electrodes and so determine the arrival of a single ion in the substrate.

2. A method according to claim 1, where the substrate is a high resistivity silicon substrate and the ions are $^{31}P$.

3. A method according to claim 1, including the step of generating a focused beam of ions from a field ionisation ion source producing sub-20 nm ion beam probes.

4. A method according to claim 3, including the step of gating off the beam after a single ion arrival is detected.

5. A method according to claim 1, including a preliminary step of applying ionising radiation to cause detectable ionisation.

6. A method according to claim 5, where the ionising radiation is X-rays or electrons.

7. A method according to claim 1, including the step of measuring the polarity of the ion-impact-induced signal as a measure of the proximity of the ion strike to one or other electrode.

8. A method according to claim 1, including the step of moving a mask to a new position above the substrate for a further implant after a single ion arrival is detected.

9. A method according to claim 1, including the steps of applying a thin, ion sensitive resist to the substrate, and later processing the resist to reveal the impact sites of single ions.

10. A method according to claim 1, including the steps of applying a thick resist layer to the substrate surface, and opening apertures in the resist for the implantation of single ions.

11. A method according to claim 10, where two apertures are opened in the mask by electron beam lithography and subsequent processing.

12. A method according to claim 11, including the steps of fabricating a linear metal electrodes on the substrate surface using EBL, depositing a resist layer, drawing a cross line with the EBL system across the linear electrodes which upon development opens a path to the surface leaving the substrate exposed, and implanting ions down the paths beside the electrode.

13. A method according to claim 8, where the moveable mask is a nanomachined aperture in an AFM cantilever which is accurately positionable over the substrate surface.

14. A method according to claim 13, where the nanomachined aperture is fabricated using a Focused Ion Beam (FIB).

15. A method according to claim 14, where the Focused Ion Beam (FIB) has a diameter less than 20 nm.

16. A method according to claim 15, including the steps of imaging the cantilever tip with the FIB, and then drilling the nanomachined aperture at a known location relative to the cantilever tip.

17. A method according to claim 13, including the step of positioning the nanomachined aperture using STM or AFM to first locate and image registration marks on the substrate using the cantilever.

18. A method according to claim 13, including, between each implant step, the step of using the cantilever to image the ion impact site and verify that a single ion has been successfully delivered to the substrate.

19. A method according to claim 1, including the steps of dwelling a FIB on a location on the substrate surface where an ion is to be implanted until a single ion impact is detected, and then scanning an FIB over the substrate to a new location, and repeating the dwelling step.

20. A method according to claim 19 where the FIB is a sub-20 nm spot.

21. A method according to claim 19, including the step using a nanomachined mask and dwelling the FIB on the apertures in the mask.

22. A method according to claim 1, including the step of using a focused laser beam to anneal the ion beam induced damage from the single ion impacts.

23. A method according to claim 1, including the step of cooling the substrate to allow sufficient signal to noise ratio to detect single keV ions.

24. A system according to claim 1, including a cooling system to cool the substrate to allow sufficient signal to noise ratio to detect single keV ions.

25. A quantum computer fabricated using the method of any one of claims 1 to 23.

26. A nanomachined optical fibre fabricated using the method of any one of claims 1 to 23.

27. An integrated chip having controlled dopant implantation fabricated using the method of any one of claims 1 to 23.

28. A resist structure having controlled dopant implantation fabricated using the method of any one of claims 1 to 23.

29. A system for single ion doping and machining by detecting the impact, penetration and stopping of a single ion in a substrate, comprising:

an electrically active substrate where ion or electron impact generates electron-hole pairs;

at least two electrodes applied to the substrate;

a potential applied across the electrodes to create a field to separate and sweep out electron-hole pairs formed within the substrate; and a current transient sensor to detect current in the electrodes and so determine the arrival of a single ion in the substrate.

30. A system according to claim 29, where the substrate is a high resistivity silicon substrate and the ions are $^{31}P$.

31. A system according to claim 29, including a gating subsystem to gate off the beam after a single ion arrival is detected.

32. A system according to claim 29, including source ionising radiation moveable between a first position adjacent the substrate to cause detectable ionisation, and a second position where it does not irradiate the substrate.

33. A system according to claim 32, where the ionising radiation is X-rays or electrons.

34. A system according to claim 29, including a mask moveable over the substrate to implant a single ion in different locations.

35. A system according to claim 29, including a mask having two apertures.

36. A system according to claim 34, where the mask is a nanomachined aperture in an AFM cantilever which is accurately positionable over the substrate surface.

37. A system according to claim 36, where the nanomachined aperture is fabricated using a Focussed Ion Beam (FIB).

38. A system according to claim 36, where the Focused Ion Beam (FIB) has a beam of diameter less than 20 nm.

* * * * *